(12) United States Patent
Attar et al.

(10) Patent No.: US 11,996,384 B2
(45) Date of Patent: May 28, 2024

(54) METHOD AND APPARATUS FOR DEBONDING TEMPORARILY BONDED WAFERS IN WAFER-LEVEL PACKAGING APPLICATIONS

(71) Applicant: NCC NANO, LLC, Dallas, TX (US)

(72) Inventors: Vahid Akhavan Attar, Austin, TX (US); Vikram S. Turkani, Austin, TX (US)

(73) Assignee: PulseForge, Inc., Austin, TX (US)

( * ) Notice: Subject to any disclaimer, the term of this patent is extended or adjusted under 35 U.S.C. 154(b) by 147 days.

(21) Appl. No.: 17/122,796

(22) Filed: Dec. 15, 2020

(65) Prior Publication Data

US 2022/0189908 A1 Jun. 16, 2022

(51) Int. Cl.
*B23K 1/00* (2006.01)
*B23K 1/018* (2006.01)
*H01L 23/00* (2006.01)

(52) U.S. Cl.
CPC ............ *H01L 24/799* (2013.01); *B23K 1/018* (2013.01); *H01L 24/98* (2013.01)

(58) Field of Classification Search
CPC ....... H01L 24/799; H01L 24/98; B23K 1/018; B23K 37/04–0408; B23K 37/0426–0461
USPC ....... 228/119, 191, 264, 13, 44.7, 49.1, 49.5
See application file for complete search history.

(56) References Cited

U.S. PATENT DOCUMENTS

| | | | | |
|---|---|---|---|---|
| 4,956,911 A * | 9/1990 | Zaremba | ............ | H05K 13/0491 228/264 |
| 6,196,439 B1 * | 3/2001 | Mays | ...................... | B23K 1/018 228/6.2 |
| 6,301,436 B1 * | 10/2001 | Hsiao | ..................... | B23K 1/018 228/264 |
| 6,357,648 B1 * | 3/2002 | Monno | .................. | B23K 1/018 228/19 |
| 7,083,327 B1 * | 8/2006 | Shepard | ................. | G01N 25/72 374/57 |
| 10,618,127 B2 * | 4/2020 | Teraoka | ................ | B23K 1/018 |
| 11,358,381 B1 * | 6/2022 | Schroder | ............ | H01L 21/6835 |
| 2008/0308231 A1 * | 12/2008 | Lee | ........................ | B32B 43/006 156/381 |
| 2017/0250171 A1 * | 8/2017 | Yu | ........................... | H01L 24/19 |
| 2017/0263518 A1 * | 9/2017 | Yu | ........................ | H01L 23/3128 |
| 2019/0348392 A1 * | 11/2019 | Chen | ..................... | H01L 24/799 |

(Continued)

FOREIGN PATENT DOCUMENTS

WO WO-9712714 A2 * 4/1997 ............. B23K 1/018

*Primary Examiner* — Kiley S Stoner

(74) *Attorney, Agent, or Firm* — Antony P. Ng; Russell Ng PLLC

(57) ABSTRACT

An apparatus for debonding a wafer from a bonded wafer stack is disclosed. The apparatus includes a flashlamp, a flashlamp control unit, and a wafer debonding unit. A processed wafer can be debonded from a bonded wafer stack by applying light pulses from the flashlamp. The flashlamp is controlled by the flashlamp control unit that includes a capacitor bank, a power supply for charging the capacitor bank, an IGBT-based switching device, and a frequency controller. The wafer debonding unit includes a debonding vacuum table, a wafer feeding robot for conveying the bonded wafer stack to the debonding vacuum table, a set of suction cups for applying vacuum to the bonded wafer stack when light pulses are being emitted by the flashlamp to debond the processed wafer from the bonded wafer stack.

5 Claims, 3 Drawing Sheets

(56) References Cited

U.S. PATENT DOCUMENTS

2021/0104408 A1\* 4/2021 Sandoh ............... H01L 21/3081
2021/0358778 A1\* 11/2021 Han ................... H01L 21/6836
2022/0127496 A1\* 4/2022 Puligadda .......... C08G 73/0233

\* cited by examiner

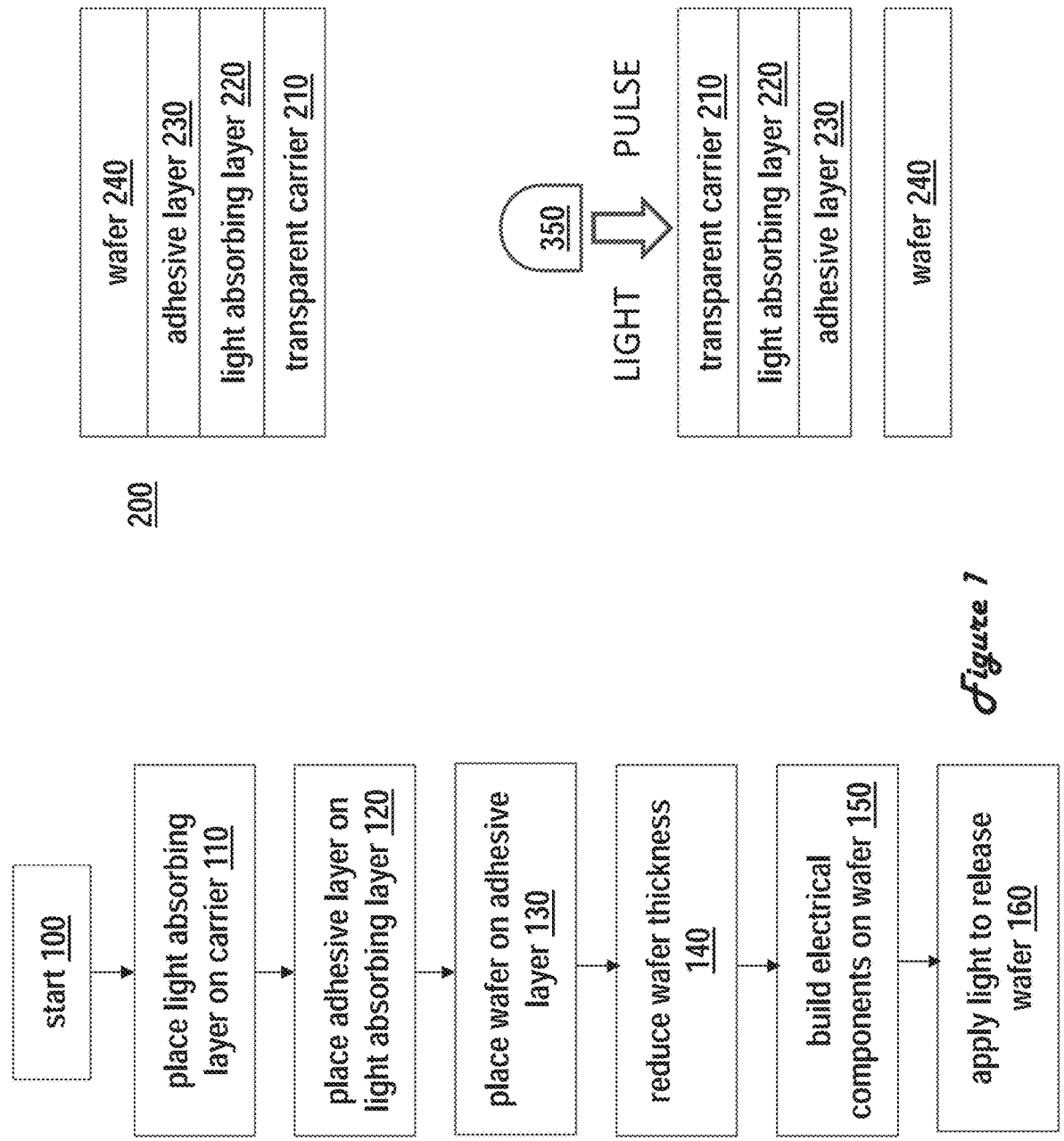

METHOD AND APPARATUS FOR DEBONDING TEMPORARILY BONDED WAFERS IN WAFER-LEVEL PACKAGING APPLICATIONS

TECHNICAL FIELD

The present application relates to method and apparatus for processing integrated circuits in general, and, in particular, to a method and apparatus for debonding temporarily bonded wafers in wafer-level packaging applications.

BACKGROUND

Three-dimensional (3D) chip technologies have been gaining popularity in the microelectronics industry because of their advantages such as shorter circuit paths, higher performance, less power consumption and faster heat dissipation. With 3D chip technologies, multiple heterogeneous silicon wafers can be stacked vertically to form a 3D integrated circuit. The silicon wafers are relatively thin (50-100 µm) such that they can be interconnected by utilizing through-silicon vias (TSVs).

During the manufacturing of a 3D integrated circuit, a thinning step is required to be performed on each silicon wafer of the 3D integrated circuit in order to reduce the thickness of the silicon wafer. The silicon wafer is typically bonded to a rigid carrier prior to the thinning process. Existing approaches for bonding a silicon wafer to a carrier involve the use of an adhesive placed directly between the silicon wafer and the carrier. After back-grinding and all the required backside processing have been performed on the silicon wafer, the thinned silicon wafer needs to be debonded from the carrier. Wafer debonding is the process of separating the processed silicon wafer from the carrier so that the processed wafer can progress to its intended application.

The present disclosure provides an apparatus and method for debonding a silicon wafer from a carrier during the manufacturing of 3D integrated circuits.

SUMMARY OF THE INVENTION

In accordance with one embodiment, an apparatus for debonding a wafer from a bonded wafer stack includes a flashlamp, a flashlamp control unit, and a wafer debonding unit. The bonded wafer stack includes a wafer attaching to a carrier via a light absorbing layer and an adhesive layer. The wafer can be debonded from the carrier by applying light pulses from the flashlamp. The flashlamp is controlled by the flashlamp control unit that includes a capacitor bank, a power supply for charging the capacitor bank, an IGBT-based switching device, and a frequency controller. The wafer debonding unit includes a debonding vacuum table, a wafer feeding robot for conveying the bonded wafer stack to the debonding vacuum table, and a set of suction cups for applying vacuum to the bonded wafer stack after light pulses have been emitted by the flashlamp to debond the processed wafer from the bonded wafer stack.

The bonded wafer stack is initially placed underneath the flashlamp. The light pulse from the flashlamp is applied to a non-wafer side of the carrier in order to heat up the light absorbing layer, which in turn conducts the absorbed heat to the adhesive layer such that the adhesive layer is heated to a point that the wafer becomes loosen from the carrier. At this point, the wafer can easily be removed from the carrier.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein:

FIG. 1 is a flow diagram of a method for debonding a wafer from a carrier, according to one embodiment:

FIG. 2A is a diagram of a bonded wafer stack made by the method depicted in FIG. 1;

FIG. 2B shows a wafer being released from the bonded wafer stack from FIG. 2A;

DETAILED DESCRIPTION OF A PREFERRED EMBODIMENT

Figure 3:
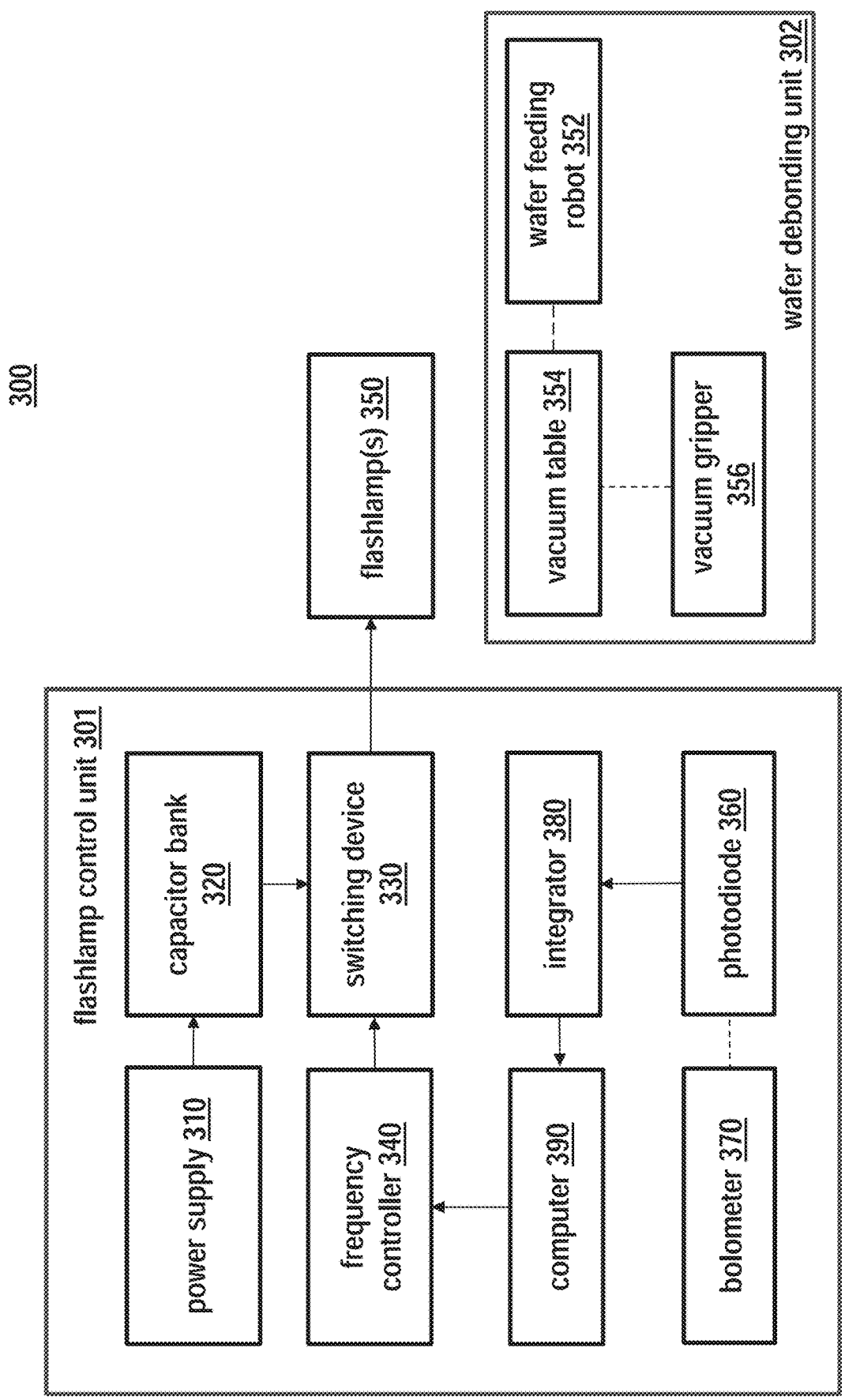
FIG. 3 is a block diagram of an apparatus for debonding a wafer from a carrier, according to one embodiment.

Current techniques for debonding a silicon wafer from a carrier include: (a) using chemical solvents to dissolve the adhesive between the silicon wafer and the carrier, (b) using mechanical means to debond the silicon wafer off the carrier, and (c) heating the adhesive between the silicon wafer and the carrier to a point where the silicon wafer can be separated from the carrier by shearing. However, the usage of harsh chemicals is not very desirable. Also, shearing or high temperature may cause damage to the surface structure of the silicon wafer.

The laser-assisted wafer debonding technique is an attractive alternative due to its ability to debond silicon wafers at room temperature. However, there are also some disadvantages associated with the laser-assisted wafer debonding technique, such as variations in the sensitivity of a laser beam's focal point with variation in the thickness of a wafer-carrier stack, power fluctuations of the laser beam, requirement of special beam focusing objectives, need for scanning optics, and low throughput due to beam width limitations, especially when processing a larger size wafer (>300 mm).

Referring now to the drawings and in particular to FIG. 1, there is depicted a flow diagram of a method for debonding a wafer from a carrier, according to one embodiment. Starting at block 100, a light absorbing layer, such as a light absorbing layer 220 in FIG. 2A, is initially placed on one side of a transparent carrier, such as a transparent carrier 210 in FIG. 2A, as shown in block 110. Light absorbing layer 220 can be applied on carrier 210 via sputtering, thermal evaporation, atomic layer deposition or vapor deposition. Light absorbing layer 220 may include a minority of another refractory metal, such as titanium, to promote adhesion to carrier 210.

Carrier 210 and light absorbing layer 220 are materials chosen to be thermally stable at an elevated temperature and have coefficients of thermal expansion (CTE) that are closely matched with each other in order to mitigate any kind of cracking or delamination of light absorbing layer 220 from carrier 210 when light absorbing layer 220 is heated.

Carrier 210 may be made of quartz, glass or any rigid material which transmits light emitted by a flashlamp.

Quartz has a CTE of $5.5 \times 10^{-7}$/K. Corning Eagle XG (a type of glass) has a CTE of about $3.2 \times 10^{-6}$/K to $3.5 \times 10^{-6}$/K. Light absorbing layer 220 may be made of metal (such as tungsten or molybdenum), metal alloy, or ceramic. Molybdenum has a CTE of $4.8 \times 10^{-6}$/K, while tungsten has a CTE of $4.5 \times 10^{-6}$/K.

One example of a good carrier-absorbing layer combination is Corning Eagle XG for carrier 210 and 90% tungsten/10% titanium at 200 nm thick for light absorbing layer 220 because the CTE between them is matched to within $1.5 \times 10^{-6}$/K.

An adhesive layer, such as an adhesive layer 230 in FIG. 2A, is then placed on light absorbing layer 220, as depicted in block 120. Adhesive layer 230 should have an adhesion strength of at least 15 psig, preferably from 50-250 psig, as determined by ASTM D4541/D7234. Adhesive layer 230 can be applied to carrier 210 in a liquid or solid film.

Adhesive layer 230 may be a thermoplastic or a crosslinkable material that is thermally or ultra-violet (UV) light cured. Adhesive layer 230 may include a polymer or oligomer dissolved or dispersed in a solvent. The polymer or oligomer is selected from a group consisting of polymers and oligomers of cyclic olefins, epoxies, acrylics, silicones, styrenics, vinyl halides, vinyl esters, polyamides, polyimides, polysulfones, polyethersulfones, cyclic olefins, polyolefin rubbers, polyurethanes, ethylene-propylene rubbers, polyamide esters, polyimide esters, polyacetals, polyazomethines, polyketanils, polyvinyl butyrals, and combinations thereof. The type of solvent used depends on the choice of polymer or oligomer.

The thermoplastic composition of adhesive layer 230 should have a viscosity at least 500,000 Pa-s, preferably from 1,000,000 Pa-s to 3,000,000 Pa-s, at room temperature, and a viscosity of less than 15,000 Pa-s, preferably from 500 Pa-s to 10,000 Pa-s, at temperatures between 160° C. and 500° C.

Adhesive layer 230 may be a nonpolymeric material with the structure of the molecule having less than one repeating subunit. When a nonpolymeric bonding material is used, the melting point of adhesive layer 230 should be below its sublimation point and has the ability to crosslink or further react in order to prevent material sublimation at high temperatures. The thermal decomposition temperature of adhesive layer 230 should be between 220° C. and 450° C.

Next, a wafer, such as a wafer 240 in FIG. 2A, is placed on adhesive layer 230, as shown in block 130. Pressure can be applied on wafer 240 to adhere wafer 240 to carrier 210. Wafer 240 may be heated during the application of pressure onto wafer 240 in order to increase the adhesive bond between carrier 210 and wafer 240. At this point, a bonded wafer stack is formed, such as a bonded wafer stack 200 shown in FIG. 2A, which includes transparent carrier 210, light absorbing layer 220, adhesive layer 230, and wafer 240.

Subsequently, the wafer side of bonded wafer stack 200 is subjected to a back-thinning process in order to reduce the thickness of wafer 240, as depicted in block 140. After the thickness of wafer 240 has been reduced, electronic devices and/or electrical components can be built on wafer 240, as shown in block 150. Although the device fabrication step is shown to be performed after the thinning step, it is understood by those skilled in the art that the device fabrication step can be performed before the thinning step or the wafer attachment step (block 130).

Afterwards, wafer 240 can be removed (debonded) from bonded wafer stack 200 by exposing the non-wafer side of transparent carrier 210 to an intense pulse of light from a flashlamp, such as a flashlamp 350 in FIG. 2B, as depicted in block 160, in order to heat up light absorbing layer 220. In turn, light absorbing layer 220 conducts the absorbed heat to adhesive layer 230. As a result, adhesive layer 230 is heated to a point that wafer 240 will be released from bonded wafer stack 200.

It is desirable to have light absorbing layer 220 to absorb as much of the light pulse (which is broadband from about 200 nm to about 1,500 nm) as possible. Increased absorbance of the light pulse from flashlamp 350 that a shorter pulse length can be used at a given intensity. This results in less stress on flashlamp 350 and less total energy deposited into wafer 240 from the debonding process. Molybdenum has an absorbance of about 55-60%, while tungsten has an absorbance of about 50-55%. Light absorbing layer 220 can be made thick enough to not pass the light emission from flashlamp 350 but thin enough to have as little thermal mass as possible during the debonding process. The thickness of light absorbing layer 220 is about 100 nm-300 nm, and preferably about 150 nm-250 nm.

Referring now to FIG. 3, there is depicted a block diagram of an apparatus for performing debonding of a wafer from a carrier, according to one embodiment. As shown, an apparatus 300 includes a flashlamp control unit 301 and wafer debonding unit 302. Flashlamp control unit 301 includes a capacitor-bank-charging power supply 310, a capacitor bank 320, an insulated gate barrier transistor (IGBT)-based switching device 330, a frequency controller 340, a photodiode 360, a bolometer 370, an integrator 380, and a computer 390. Computer 390 includes a processor and various storage devices that are well-known to those skilled in the art. The capacitors in capacitor bank 320 are, for example, electrolytic capacitors. Capacitor bank 320 may alternatively be switched with a silicon controlled rectifier (SCR) switching device.

Capacitor bank 320 can be charged by capacitor-bank-charging power supply 310. Charges from capacitor bank 320 are then discharged into flashlamp 350 via IGBT-based switching device 330 while IGBT-based switching device 330 is being switched on-and-off repeatedly by frequency controller 340 during the discharge. Frequency controller 340 controls the gating of IGBT-based switching device 330 that, in turn, controls the switching frequency of the discharge. The repeated on-and-off switching of IGBT-based switching device 330 is intended to modulate the current flow from capacitor bank 320 to flashlamp(s) 350, which in turn switches flashlamp(s) 350 on and off. In other words, the frequency or pulse length of light pulses emitted by flashlamp(s) 350 is dictated by frequency controller 340.

Photodiode 360 within flashlamp control unit 301 needs to be calibrated before operation. Photodiode 360 can be calibrated by using bolometer 370 that is National Institute of Standards and Technology (NIST) traceable. During calibration, both photodiode 360 and bolometer 370 are exposed to a single light pulse emitted from flashlamp 350. Bolometer 370 measures the radiant exposure or energy per area (in unit J/cm$^2$) of the single light pulse, and photodiode 360 measures the instantaneous power density (in unit W/cm$^2$) of the same light pulse. The instantaneous power density signals from photodiode 360 are then integrated by integrator 380 to yield a radiant exposure value of the same single light pulse, and the radiant exposure measurement from bolometer 370 is divided by this radiant exposure value from integrator 380 to generate a calibration factor as follows:

calibration factor=radiant exposure measurement/radiant exposure value

After calibration, the photodiode 360/integrator 380 combination can be utilized to provide radiant exposure information of each light pulse emitted from flashlamp 350. Basically, the radiant exposure information of a light pulse emitted from flashlamp 350 can be calculated by multiplying the calibration factor obtained during calibration with the output value of integrator 380 (which is the radiant exposure value of the light pulse emitted from flashlamp 350 formed by integrating the instantaneous power signals of the light pulse emitted from flashlamp 350 measured by photodiode 360).

Wafer debonding unit 302 includes a wafer feeding robot 352, a debonding vacuum table 354, and a vacuum gripper 356.

Figure 4:
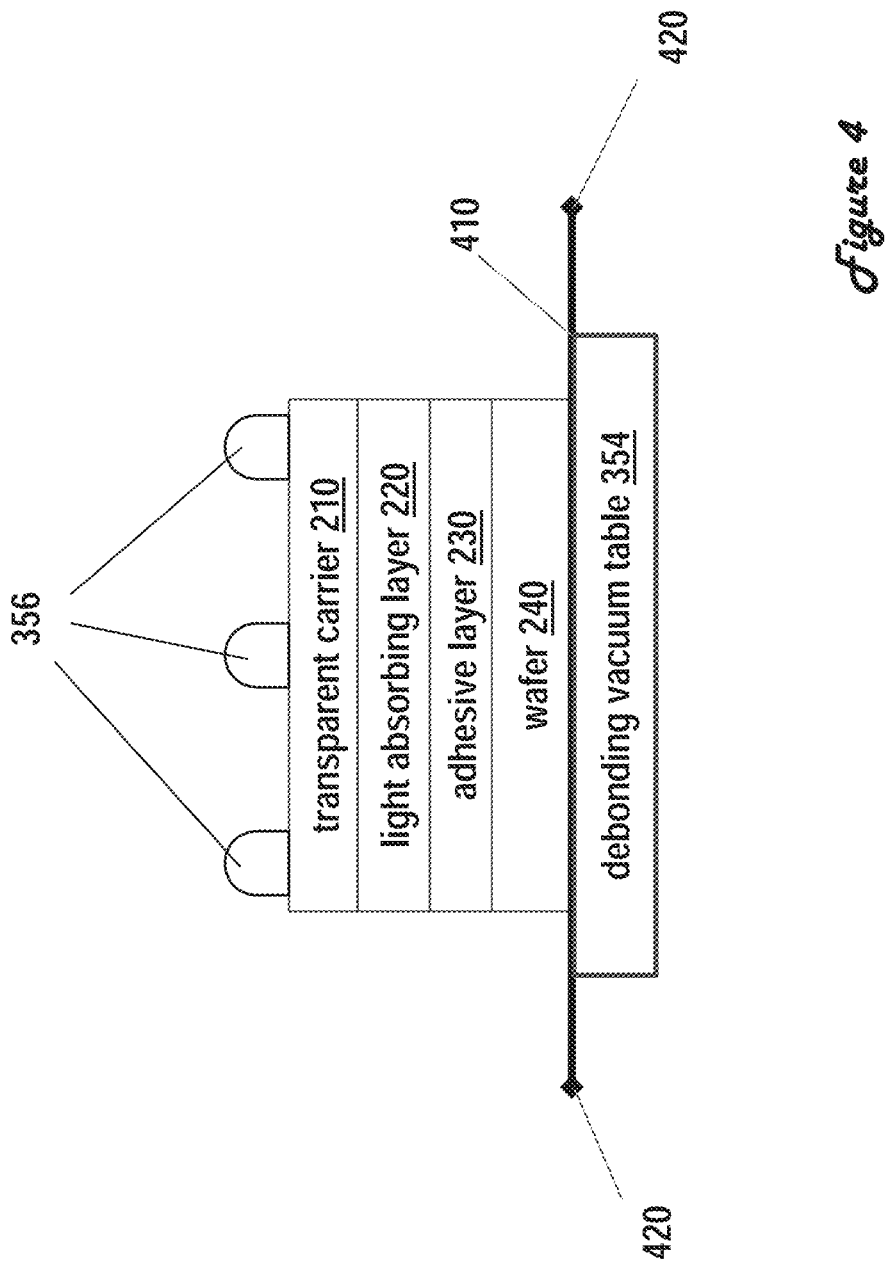
FIG. 4 illustrates a debonding vacuum table holding down a bonded wafer assembly, according to one embodiment.

Prior to debonding, a dicing tape 410 is mechanically clamped to wafer stack 200 via retaining rings 420 to form a bonded wafer assembly, as shown in FIG. 4. Wafer feeding robot 352 conveys the bonded wafer assembly to debonding vacuum table 354. A vacuum is then applied on dicing tape 410 from debonding vacuum table 354, as shown in FIG. 4. Then, an intense light pulse from flashlamp 350 is utilized to illuminate the bonded wafer assembly from the transparent side of carrier 210 to debond processed wafer from carrier 210. If the beam area of flashlamp 350 is smaller than the area of wafer 240, then wafer 240 is conveyed relative to flashlamp 350 by debonding vacuum table 354 to expose the remaining portions of wafer 240 with another intense light pulse. Next, the bonded wafer assembly along with wafer debonding table 354 is conveyed to a separation station.

At the separation station, vacuum gripper 356 separates carrier 210 from the bonded wafer assembly, while wafer 240 mounted on dicing tape 410 is being held down by debonding vacuum table 354. Both carrier 210 and wafer 240 on dicing tape 410 are conveyed to a cleaning station to remove any residual adhesive (i.e., adhesive layer 230 from FIG. 2A). Residual adhesive may be removed with a wet process via solvent or a dry process with plasma.

At this point, wafer 240 is so fragile that the vacuum being applied to wafer 240 should be distributed across wafer 240 so as not to break it during removal. This may be accomplished with multiple suction cups 430 distributed across the surface of wafer 240. Alternatively, the vacuum may be applied by a distributed vacuum, such as a vacuum table with perforated holes. Vacuum table 354 may have a polymer on its surface so that wafer 240 is not damaged during handling.

During the debonding process, apparatus 300 may have 5-lamp drivers per flashlamp using 24 mm diameter and 150 mm long lamps with 150 mm×75 mm exposure area per lamp. The flashlamps may be placed parallel to each other to increase the exposure area in increments of 75 mm. For example two flashlamps provide an exposure area of 150 mm×150 mm, three flashlamps provide an exposure area of 150 mm×225 mm, four flashlamps provide an exposure area of 150 mm×300 mm, etc. The flashlamps are placed in a common optical cavity, and the exposure is uniform to within 3%. Flashlamp drivers contain capacitors and IGBTs. The current from the capacitors is switched by the IGBTs into the flashlamps. Lamp drivers may be placed in parallel with each other to increase the peak current supplied to the flashlamps. A variable of the flashlamp system is the charging voltage of the capacitors, the total capacitance, which is determined by the number of flashlamp drivers, and the length of the pulse of light, which is switched on and off by the IGBTs. All parameters are controlled by a computer. Silicon wafer may be debonded from glass carrier plates at 900-950V at pulse durations of 50-150 microseconds, which corresponds to 2-6 J/cm$^2$ emitted with each pulse. The peak radiant power of flashlamp 350 is greater than 20 KW/cm$^2$, more preferable greater than 30 KW/cm$^2$, and even more preferable greater than 40 KW/cm.

It is noted that the thinner the wafer, the easier it is for the wafer to be debonded from a carrier plate. This is principally due to the fact that the wafer, is very thermally conductive. Silicon, for example, has a thermal conductivity of about 140 W/cm-K. This is over 100 times greater than the typical carrier plate, which is glass. As such, much of energy from the light absorbing layer is conducted to the wafer through the adhesive layer during the 50-150 microsecond long time the absorber is being irradiated by the pulse of light. When the adhesive layer reaches the debond temperature, it debonds from the carrier. The thinner the wafer, the quicker the adhesive reaches the debond temperature. Thus, a thinner wafer may be debonded with a shorter pulse of light at the same intensity. An advantage of this is that less energy is needed to perform the debond process. Additionally, the lifetime of the flashlamps in the flashlamp system is increased since duration is decreased. Alternatively, the intensity of the emission from the flashlamp may be decreased for a given pulse length. This also reduces the total amount of energy deposited into the wafer.

As has been described, the present invention provides an improved method for debonding a wafer from a carrier. There are several advantages of the present invention over the prior art. The first is that the wafer debonding can be performed with as little a single pulse of light. This means that the time to debond the wafer from the stack is dramatically reduced from several 10s of seconds (or longer) to less than 150 microseconds for a single pulse or less than 10 seconds, or even less than 2 for two pulses. Another advantage over the prior art is that the need for rastering the light emission to scan the entire wafer is greatly reduced or eliminated. This dramatically reduces the complexity of the apparatus by eliminating the need for complex scanning optics. A further advantage over the prior art is that the inhomogeneities in the debonding process from hundreds of pulses are greatly reduced since the entire wafer sees the same time temperature history from one or two pulses of light. The same time temperature history in the debonding process has the implication that the wafer is more cleanly debonded than in the prior art. This further reduces the amount of time it takes to remove any residual bonding adhesive from the wafer and carrier plate at the cleaning station over the prior art.

While the invention has been particularly shown and described with reference to a preferred embodiment, it will be understood by those skilled in the art that various changes in form and detail may be made therein without departing from the spirit and scope of the invention.

What is claimed is:

1. An apparatus for debonding a wafer from a bonded wafer stack, said apparatus comprising:
   a flashlamp for emitting light pulses to debond a processed wafer from a bonded wafer stack;
   a flashlamp control unit for controlling said flashlamp, wherein said flashlamp control unit includes
     a capacitor bank;
     a power supply for charging said capacitor bank;
     an IGBT-based switching device; and
     a frequency controller; and
   a wafer debonding unit includes:
     a debonding vacuum table for holding down said bonded wafer stack;

a wafer feeding robot for transporting said bonded wafer stack to and from said debonding vacuum table; and a vacuum gripper for removing said carrier from said bonded wafer stack after said light pulses have been emitted by said flashlamp to debond said processed wafer from said bonded wafer stack.

2. The apparatus of claim 1, wherein said wafer debonding unit further includes a plurality of suction cups.

3. The apparatus of claim 1, wherein said flashlamp receives charges from said capacitor bank via said IGBT-based switching device while said IGBT-based switching device is being switched on-and-off repeatedly by said frequency controller in order to modulate the flow of said charge from said capacitor bank to said flashlamp, which in turn switches said flashlamp on and off.

4. The apparatus of claim 1, wherein said capacitor bank is switched by a silicon controlled rectifier (SCR) switching device.

5. The apparatus of claim 1, wherein said bonded wafer stack includes a wafer attaching to a carrier via a light absorbing layer and an adhesive layer.

\* \* \* \* \*

UNITED STATES PATENT AND TRADEMARK OFFICE
CERTIFICATE OF CORRECTION

PATENT NO. : 11,996,384 B2
APPLICATION NO. : 17/122796
DATED : May 28, 2024
INVENTOR(S) : Vahid Akhavan Attar et al.

Page 1 of 1

It is certified that error appears in the above-identified patent and that said Letters Patent is hereby corrected as shown below:

In the Claims

Column 7
Line 4, Claim 1 delete "carrier" and insert --processed wafer-- therefor.

Column 7
Line 21, Claim 5 delete "a wafer" and insert --said processed wafer-- therefor.

Signed and Sealed this
Twenty-second Day of April, 2025

Coke Morgan Stewart
*Acting Director of the United States Patent and Trademark Office*